United States Patent [19]

Ramer et al.

[11] Patent Number: 6,045,030
[45] Date of Patent: Apr. 4, 2000

[54] SEALING ELECTRONIC PACKAGES CONTAINING BUMPED HYBRIDS

[75] Inventors: O. Glenn Ramer, Los Angeles; John J. Drab, Santa Barbara; Venita L. Dyer, Sherman Oaks, all of Calif.

[73] Assignee: Raytheon Company, Lexington, Mass.

[21] Appl. No.: 08/816,632

[22] Filed: Mar. 13, 1997

[51] Int. Cl.[7] .............................. B23K 31/02; B23K 1/20
[52] U.S. Cl. ....................... 228/124.6; 228/118; 228/121; 228/180.22
[58] Field of Search ............................ 228/180.02, 124.6, 228/175, 118, 121

[56] References Cited

U.S. PATENT DOCUMENTS

| | | | |
|---|---|---|---|
| 4,683,645 | 8/1987 | Naguib et al. | 438/297 |
| 4,950,623 | 8/1990 | Dishon | 438/614 |
| 5,162,257 | 11/1992 | Yung | 438/613 |
| 5,341,564 | 8/1994 | Akhavain et al. | 29/832 |
| 5,547,740 | 8/1996 | Higdon et al. | 428/209 |
| 5,646,439 | 7/1997 | Kitayama et al. | 257/632 |
| 5,943,597 | 8/1999 | Kleffner et al. | 438/613 |

Primary Examiner—Patrick Ryan
Assistant Examiner—Kiley Stoner
Attorney, Agent, or Firm—Colin M. Raufer; Leonard A. Alkov; Glenn H. Lenzen, Jr.

[57] ABSTRACT

A method of packaging hybrid wafers or die that are interconnected using soft metal bumps, such as indium, in a sealed ceramic package. The present invention passivates the hybrid die that are to be interconnected by way of the bumps, so that the metal in the bumps (indium) does not wet the surface of the hybrid die when the ceramic package is sealed at high temperature. Vias are formed in the passivated surfaces to expose underlying contact areas. Bumps are then formed on the contact areas, and the bumped and passivated hybrid die are electrically interconnected. The ceramic package containing the electrically interconnected hybrid die is processed at a temperature above the melting temperature of the bumps to attach a ceramic cover to the ceramic package. The method is performed at a temperature well in excess of the melting temperature of the bumps (~155° Celsius for indium), typically on the order of 325° Celsius. The surface tension of the indium maintains the bump structure and electrical contact between the two hybrid die. The present invention may also be employed with flip chip and multi-chip module ceramic packages.

13 Claims, 1 Drawing Sheet

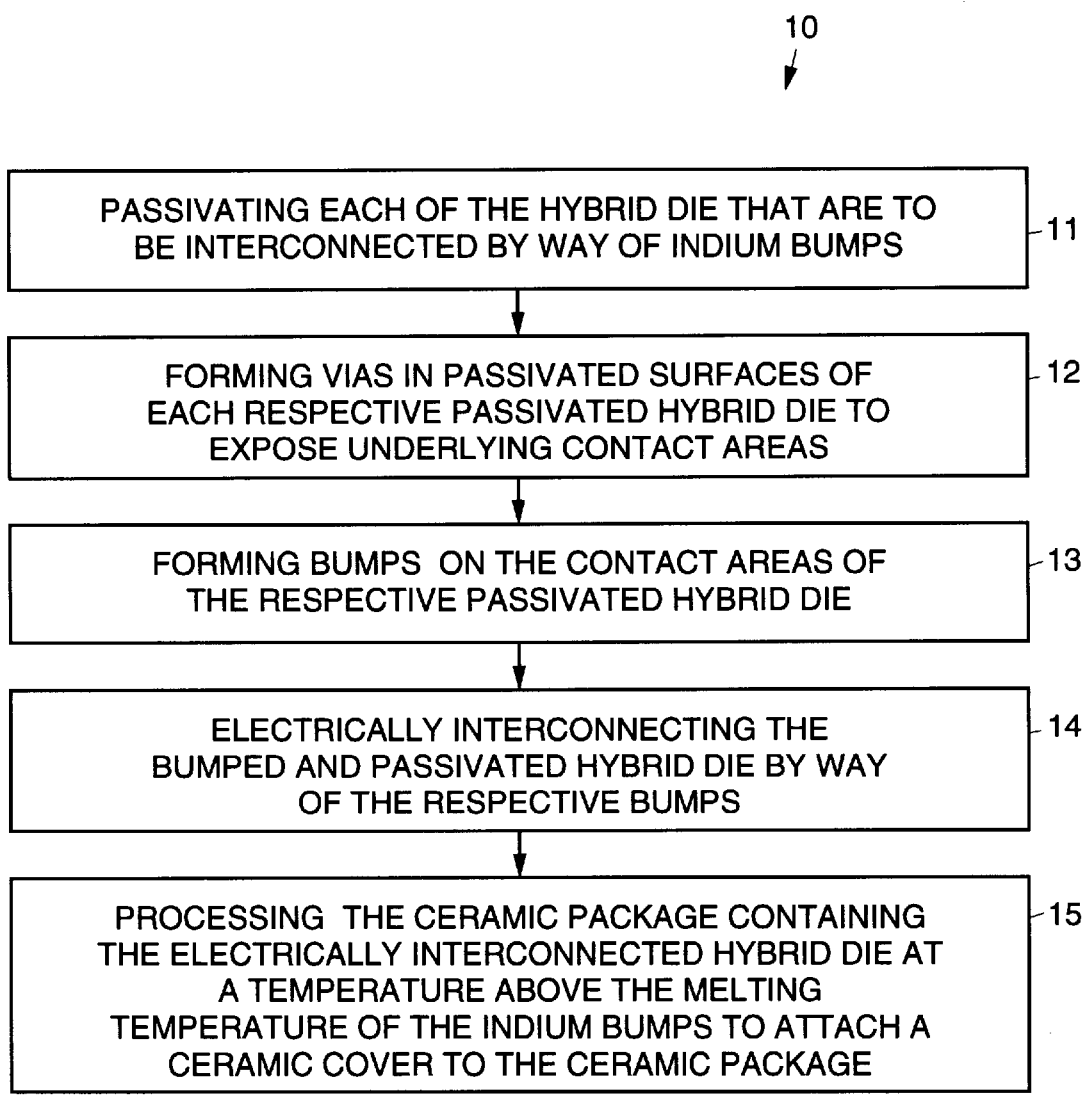

SEALING ELECTRONIC PACKAGES CONTAINING BUMPED HYBRIDS

GOVERNMENT RIGHTS

The present invention was developed with the support of the U.S. Government under contract number N00030-95-C-0012 awarded by the U.S. Navy. The U.S. Government has certain rights in this invention.

BACKGROUND

The present invention relates generally to sealing of electronic packages containing bumped hybrids, and more particularly, to a method of sealing electronic packages containing bumped hybrids at a temperature greater than the melting temperature of the bumps.

Prior art packaging of electronic packages containing bumped hybrids, such as ferroelectric nonvolatile hybrid memories, for example, involved seam sealing of a Kovar lid to a ceramic package that was coupled to a heat sink. This technology is not acceptable for strategic military applications. In addition, seam sealing must be performed in a non-oxidizing environment such as nitrogen.

However, it is desirable to package ferroelectric nonvolatile hybrid memories in an oxidizing environment. Consequently, it was determined that an acceptable prior art technology did not exist that could adequately seal ferroelectric hybrids. The prior art technology has not sealed hybrids at temperatures above the melting temperature of indium.

An extensive packaging development effort was undertaken by the assignee of the present invention to develop a low temperature packaging technology which provided for sealing a ceramic package with ceramic lid in an oxidizing environment. The present invention resulted from the development efforts.

Accordingly, it is an objective of the present invention to provide for a method of sealing electronic packages containing bumped hybrids at a temperature greater than the melting temperature of the bumps. It is a more specific objective of the present invention to provide for a method of sealing electronic packages containing indium bumped hybrids at a temperature greater than the melting temperature of indium.

SUMMARY OF THE INVENTION

To meet the above and other objectives, the present invention provides for a method of packaging hybrids containing components, such as hybrid wafers or hybrid die that are interconnected using bumps, such as indium or other soft metal, at temperatures well in excess of the melting temperature of the bump. For indium this melting temperature is approximately 155° Celsius. A reduced to practice embodiment of the present invention used an indium bumped hybrid at a temperature of 325° C. in a belt furnace.

More specifically, a reduced to practice method comprises passivating each of the hybrid die, forming vias in the passivated surfaces to expose underlying contact areas, forming bumps on the contact areas, electrically interconnecting the bumped and passivated hybrid die, and processing the ceramic package containing the electrically interconnected hybrid die at a temperature above the melting temperature of the bumps to attach a ceramic cover to the ceramic package.

The key to the present invention is to appropriately passivate the hybrid die that are to be interconnected by way of the bumps, such that the metal comprising the bumps (indium, for example) does not wet the surface of the hybrid die when the ceramic package is sealed at high temperature. The surface tension of the indium or other soft metal maintains the structure of the bump and electrical contact between the two hybrid die.

Commercial applications of the present invention relate to flip chip and multi-chip module applications. These applications typically use larger bumps than in a typical hybrid for which the present invention was specifically developed. However, the present invention may be readily employed to seal flip chip and multi-chip module packages containing indium bumps, or other soft metal bumps, such as those containing lead-tin solder, for example.

BRIEF DESCRIPTION OF THE DRAWINGS

The various features and advantages of the present invention may be more readily understood with reference to the following detailed description taken in conjunction with the accompanying drawing, which illustrates a method of packaging hybrids containing indium bumps in accordance with the principles of the present invention.

DETAILED DESCRIPTION

The present invention resulted from a developmental effort that involved a number of attempts to reduce the invention to practice. The first attempt to reduce the invention to practice failed. A hybrid was processed that contained a passivated silicon on sapphire die and an unpassivated ferroelectric memory array disposed on the passivated silicon on sapphire die. The hybrid was processed by heating it in a belt furnace.

After the hybrid was passed through the belt furnace, the hybrid was not functional. The hybrid was disassembled to reveal that the bumps were present on the silicon on sapphire die but could not be found on the ferroelectric memory array. A conclusion was reached that the indium contained in the bumps wetted the surface of the metal on the surface of the ferroelectric die and flowed. However, the indium did not wet the passivation on the silicon on sapphire die and remained intact.

A second attempt was made using a silicon on sapphire die that was used to verify the survivability of indium bumps. Pre- and post-examination of the bumps under a microscope revealed little if any change.

The third attempt was made using a ceramic hybrid package that contained a passivated ferroelectric memory array and a passivated silicon on sapphire die. The hybrid survived processing in the belt furnace and was functional prior to and after the belt furnace processing. However, the performance of the hybrid was not absolutely identical before and after the processing, but it was not determined what caused this problem. The problem could have been a result of a number of causes including bumps, ferroelectric degradation, or degradation of the interconnect path.

To evaluate this, the hybrid used in the third attempt was disassembled (dehybridized) and examined under a microscope. The bumps remained in place. Upon disassembly of the hybrid, the individual bumps either came apart at the interface between the two contacting bumps, at the silicon on sapphire contact interface or at the ferroelectric memory array contact interface. Therefore it was determined that the bumps survived the high temperature processing and the problem was not related to bumps degradation.

In view of the above, and with reference to the drawing figure, it illustrates a reduced to practice method 10 of packaging hybrids containing indium bumps in accordance with the principles of the present invention. Although the present invention is described with reference to the use of indium bumps, it is to be understood that the present invention is not limited to just indium, but bumped hybrids having bumps made of other soft metals, such as bumps made of lead-tin solder, for example, may readily be processed using the principles of the present invention.

With specific regard to the reduced to practice embodiment of the present invention, the method 10 produces a sealed ceramic hybrid package that contains hybrid die that are interconnected using indium bumps. The ceramic hybrid package containing interconnected hybrids is sealed with a ceramic cover at a temperature well in excess of the melting temperature of the indium bumps.

The method 10 packages hybrid wafers or die in a sealed ceramic package wherein the hybrid die that are interconnected using indium bumps at relatively high temperatures. Sealing of the ceramic package is done at a temperature well in excess of the melting temperature of indium (~155° C.) contained in the bumps.

More specifically, the method 10 passivates 11 each of the hybrid die that are to be interconnected by way of the indium bumps. In particular, respective surfaces of the hybrid die that are to be interconnected by indium bumps are passivated 11. Passivation may be achieved by deposition a glass material, for example, such as by using a low pressure chemical vapor deposition of process that decomposes Silox to create the glass. Then each of the respective passivated hybrid die have vias formed 12 in the passivated surfaces to expose underlying contact areas. The vias may be formed by masking and etching techniques, such as plasma etching, for example. Bumps are formed 13 on the contact areas of the respective passivated hybrid die. Bumps may be formed by a lift off technique, for example. Using the lift off technique, photoresist is deposited and exposed using a negative mask. After development of the photoresist holes are formed at the desired locations of the bumps. Indium is then deposited and unwanted indium is removed by dissolving the photoresist to leave bumps at the locations of the holes. The bumped and passivated hybrid die are then electrically interconnected 14 by way of the respective bumps. This structure is then processed 15 at a temperature above the melting temperature of the indium bumps to attach a ceramic cover to the ceramic package. The cover is attached by aligning the bumps using alignment marks, for example, and using an infrared microscope that allows viewing of the substrate through the silicon. Pressure is applied to the structure which presses the bumps together and cold welds the bumps.

Commercially available ceramic packaging technology is readily available that may be used to seal the ceramic cover to the ceramic package. The key aspect of the present invention is that by passivating 11 the hybrid die and then interconnecting them using indium bumps allows the electrically connected hybrid die to be subjected to relatively high processing temperatures used to seal the ceramic cover to the ceramic package. As mentioned above, sealing of the ceramic cover to the ceramic package containing passivated and bump interconnected hybrid die may be performed to a temperature of up to about 350° Celsius, which is well above the melting point of indium.

The package containing the passivated and bump interconnected hybrid die may be processed 15 in a belt furnace, for example, to seal the ceramic package. The passivation on the respective hybrid die insures that the indium contained in the bumps does not wet the surface of the hybrid die. The surface tension of the indium maintains the structure of the bump during heating, and the electrical contact between the two hybrid die is maintained. A reduced to practice embodiment of the present invention was performed at a temperature of 325° C. in a belt furnace.

Commercial applications of the present invention relate to flip chip and multi-chip module applications. These applications typically use larger bumps than in a typical hybrid for which the present invention was specifically developed. However, the present invention may be readily employed to seal flip chip and multi-chip module packages containing indium bumps or bumps of other soft metals.

Thus, method of sealing electronic packages containing bumped hybrids at a temperature greater than the melting temperature of the bumps has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A method of sealing a ceramic package containing hybrid die that are interconnected using bumps, said method comprising the steps of:

passivating each of the hybrid die that are to be interconnected by way of the bumps;

forming vias in passivated surfaces of each respective passivated hybrid die to expose underlying contact areas;

forming bumps on the contact areas of the respective passivated hybrid die;

electrically interconnecting the bumped and passivated hybrid die by way of the respective bumps; and processing the ceramic package containing the electrically interconnected hybrid die at a temperature above the melting temperature of the bumps to attach a ceramic cover to the ceramic package.

2. The method of claim 1 wherein the step of processing the ceramic package comprises processing the ceramic package at a temperature of about 325° Celsius.

3. The method of claim 1 wherein the step of processing the ceramic package comprises processing the ceramic package at a temperature of about 325° Celsius in a belt furnace.

4. The method of claim 1 wherein the bumps comprise soft metal bumps.

5. The method of claim 4 wherein the soft metal bumps comprise indium.

6. The method of claim 4 wherein the soft metal bumps comprise lead-tin solder.

7. The method of claim 1 wherein the passivating step comprises the step of:

passivating each of the hybrid die by depositing glass material on the hybrid die.

8. The method of claim 6 wherein the passivating step comprises the step of:

passivating each of the hybrid die using a low pressure chemical vapor deposition process that decomposes Silox to create a glass passivation layer.

9. A method of sealing a ceramic package containing hybrid die that are interconnected using indium bumps, said method comprising the steps of:

passivating each of the hybrid die that are to be interconnected by way of the indium bumps;

forming vias in passivated surfaces of each respective passivated hybrid die to expose underlying contact areas;

forming bumps on the contact areas of the respective passivated hybrid die;

electrically interconnecting the bumped and passivated hybrid die by way of the respective bumps; and processing the ceramic package containing the electrically interconnected hybrid die at a temperature above the melting temperature of the indium bumps to attach a ceramic cover to the ceramic package.

10. The method of claim 9 wherein the step of processing the ceramic package comprises processing the ceramic package at a temperature of about 325° Celsius.

11. The method of claim 9 wherein the step of processing the ceramic package comprises processing the ceramic package at a temperature of about 325° Celsius in a belt furnace.

12. The method of claim 9 wherein the passivating step comprises the step of:

passivating each of the hybrid die by depositing glass material on the hybrid die.

13. The method of claim 12 wherein the passivating step comprises the step of:

passivating each of the hybrid die using a low pressure chemical vapor deposition process that decomposes Silox to create a glass passivation layer.

* * * * *